United States Patent
Kane et al.

(10) Patent No.: US 8,536,555 B2
(45) Date of Patent: Sep. 17, 2013

(54) VOLTAGE SENSITIVE RESISTOR (VSR) READ ONLY MEMORY

(71) Applicant: International Business Machines Corporation, Armonk, NY (US)

(72) Inventors: Terence L. Kane, Wappinger Falls, NY (US); Yun-Yu Wang, Poughquag, NY (US); Keith Kwong Hon Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/792,015

(22) Filed: Mar. 9, 2013

(65) Prior Publication Data

US 2013/0189824 A1 Jul. 25, 2013

Related U.S. Application Data

(62) Division of application No. 12/827,197, filed on Jun. 30, 2010.

(51) Int. Cl.
*H01L 29/02* (2006.01)

(52) U.S. Cl.
USPC ..... 257/2; 257/3; 257/4; 257/5; 257/E29.002; 438/102; 438/103; 438/104

(58) Field of Classification Search
USPC ............. 257/2–5, E29.002; 438/102–104; 365/163
See application file for complete search history.

(56) References Cited

U.S. PATENT DOCUMENTS

2010/0025819 A1* 2/2010 Domenicucci et al. ....... 257/536

* cited by examiner

*Primary Examiner* — Jami M Valentine
(74) *Attorney, Agent, or Firm* — Joseph P. Abate; Ira D. Blecker (57) ABSTRACT

A method to form a voltage sensitive resistor (VSR) read only memory (ROM) device on a semiconductor substrate having a semiconductor device including depositing by chemical vapor deposition (CVD) a titanium nitride layer having residual titanium-carbon bonding such that the VSR is resistive as formed and can become less resistive by at least an order of $10^2$ when a predetermined voltage and current are applied to the VSR; and applying a predetermined voltage and current so as to make the CVD titanium nitride less resistive by at least an order of $10^2$.

20 Claims, 13 Drawing Sheets

VOLTAGE SENSITIVE RESISTOR (VSR) READ ONLY MEMORY

RELATED APPLICATION

The present application is a divisional of U.S. patent application Ser. No. 12/827,197, entitled "VOLTAGE SENSITIVE RESISTOR (VSR) READ ONLY MEMORY", filed Jun. 30, 2010, now U.S. Pat. No. 8,466,443, the disclosure of which is incorporated by reference herein.

BACKGROUND OF THE INVENTION

The present invention relates to a nonvolatile semiconductor memory device for nonvolatilely writing data in accordance with the application of a voltage to a voltage sensitive resistor.

Today's computers need to store more data than ever. Consequently, memory and storage devices are very important to the effectiveness of modern computers. Many recent storage devices replace moving parts with solid-state electronics. Since real estate on a semiconductor device is limited, memory and storage designs that store the most data in the smallest areas are in demand. High density memory which stores the most data in the smallest areas is important, and may even be necessary, in many applications.

BRIEF SUMMARY OF THE INVENTION

The various advantages and purposes of the present invention as described above and hereafter are achieved by providing, according to a first aspect of the invention, a method of forming a voltage sensitive resistor (VSR) read only memory (ROM) device on a semiconductor substrate having a semiconductor device. The method includes forming a VSR in electrical contact with the semiconductor device: forming a layer of insulation on the semiconductor device; forming an opening in the insulation, the opening aligned with the semiconductor device; depositing a layer of physically deposited elemental titanium in the opening; depositing on the elemental titanium by chemical vapor deposition a first titanium nitride layer having residual titanium-carbon bonding such that the VSR is resistive as formed and can become less resistive by at least an order of $10^2$ when a predetermined voltage and current are applied to the VSR; depositing on the first titanium nitride layer by chemical vapor deposition a second titanium nitride layer having residual titanium-carbon bonding such that the VSR is resistive as formed and can become less resistive by at least an order of $10^2$ when a predetermined voltage and current are applied to the VSR; treating the second titanium nitride layer to substantially remove the titanium-carbon bonding; and depositing a metallic layer in contact with the second titanium nitride layer. The VSR in electrical contact with the semiconductor device forms a VSR ROM device and wherein the VSR ROM device is a write once read only memory (WO ROM) device.

According to a second aspect of the invention, there is provided a method of forming a voltage sensitive resistor (VSR) read only memory (ROM) device on a semiconductor substrate having a semiconductor device. The method includes forming a VSR in electrical contact with the semiconductor device including: depositing a layer of physically deposited elemental titanium on the semiconductor device; depositing by chemical vapor deposition a first titanium nitride layer having residual titanium-carbon bonding such that the VSR is resistive as formed and can become less resistive by at least an order of $10^2$ when a predetermined voltage and current are applied to the VSR; depositing by chemical vapor deposition a second titanium nitride layer having residual titanium-carbon bonding such that the VSR is resistive as formed and can become less resistive by at least an order of $10^2$ when a predetermined voltage and current are applied to the VSR; treating the second titanium nitride layer to substantially remove the titanium-carbon bonding; and depositing a metallic layer in contact with the second titanium nitride layer. The VSR in electrical contact with the semiconductor device forms a VSR ROM device and the VSR ROM device is a write once read only memory (WO ROM) device.

According to a third aspect of the invention, there is provided a method of forming a voltage sensitive resistor (VSR) read only memory (ROM) device in a back end of the line (BEOL) wiring layer on a semiconductor substrate having a semiconductor device. The method includes the steps of: forming a BEOL wiring sub-layer having first wiring lines in an X-direction; forming a first via in contact with at least one of the first wiring lines, the first via comprising a VSR having a chemically vapor deposited (CVD) titanium nitride layer having residual titanium-carbon bonding such that the VSR is resistive as formed and can become less resistive by at least an order of $10^2$ when a predetermined voltage and current are applied to the VSR; forming a BEOL wiring sub-layer having second wiring lines in a Y-direction, at least one of the second wiring lines in contact with the first via; forming a second via in contact with the at least one of the second wiring lines, the second via comprising a VSR having a CVD titanium nitride layer having residual titanium-carbon bonding such that the VSR is resistive as formed and can become less resistive by at least an order of $10^2$ when a predetermined voltage and current are applied to the VSR; forming a BEOL wiring sub-layer having third wiring lines in an X-direction, at least one of the third wiring lines in contact with the second via; and connecting the VSRs in the first and second vias to the semiconductor device. The VSRs connected with the semiconductor device form a VSR ROM device and wherein the VSR ROM device is a write once read only memory (WO ROM) device.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

The present invention relates to a voltage sensitive resistor (VSR) which is resistive when formed but when a high voltage and high current are passed through the VSR, the VSR becomes conductive. The high voltage and high current causes an irreversible change in the VSR so that the change from resistive to conductive occurs only once. The VSR may be used as memory or storage to store data. Because the change from resistive to conductive occurs only once, it is said that the VSR is a write once, read only memory device.

Chemically vapor deposited (CVD) titanium nitride is used in the VSR. In the use of CVD titanium nitride, a gas carrier containing a titanium nitride precursor is applied to a substrate such as a semiconductor wafer. Ideally, the titanium nitride precursor should form a titanium nitride layer. In actuality, what is formed is an imperfect titanium nitride which contains titanium-carbon bonding. The compound thus formed is very resistive having a resistance on the order of mega-ohms (million ohms). In normal processing, the titanium nitride having the titanium-carbon bonding is treated in forming gas ($H_2N_2$) to partially or fully remove the carbon to result in the desired titanium nitride having much lower resistance.

The present inventors have found that when the titanium nitride having the titanium-carbon bonding (hereafter called "untreated titanium nitride") is formed, a high voltage and a high current may be applied to the untreated titanium nitride to render it conductive having a resistance on the order of ohms instead of mega-ohms. Thus, the conductivity may improve by a factor of about $10^4$ after the application of a high voltage and high current. It is believed that the application of the high voltage and high current causes the titanium-carbon bonds to break, thereby resulting in elemental titanium which is a much better conductor than a compound having titanium-carbon bonding.

If the CVD titanium nitride is totally untreated in forming gas thereby resulting in the highest amount of titanium-carbon bonding, the material will be highly resistive and thus application of a high voltage and high current will result in the greatest improvement in conductivity by about a factor of $10^4$. If the CVD titanium nitride is partially treated in forming gas, the amount of titanium-carbon bonding will be less and so the material will be less resistive. Then, the application of a high voltage and high current will result in the smallest improvement in conductivity by about a factor of $10^2$. Thus, the improvement in conductivity of the CVD titanium nitride by application of a high voltage and high current may be tailored to result in the desired improvement in conductivity. For purposes of the present invention, it is preferred that the improvement in conductivity of the CVD titanium nitride be at least by a factor of $10^2$, more preferably by a factor of $10^3$ and most preferably by a factor of $10^4$.

Figure 1:
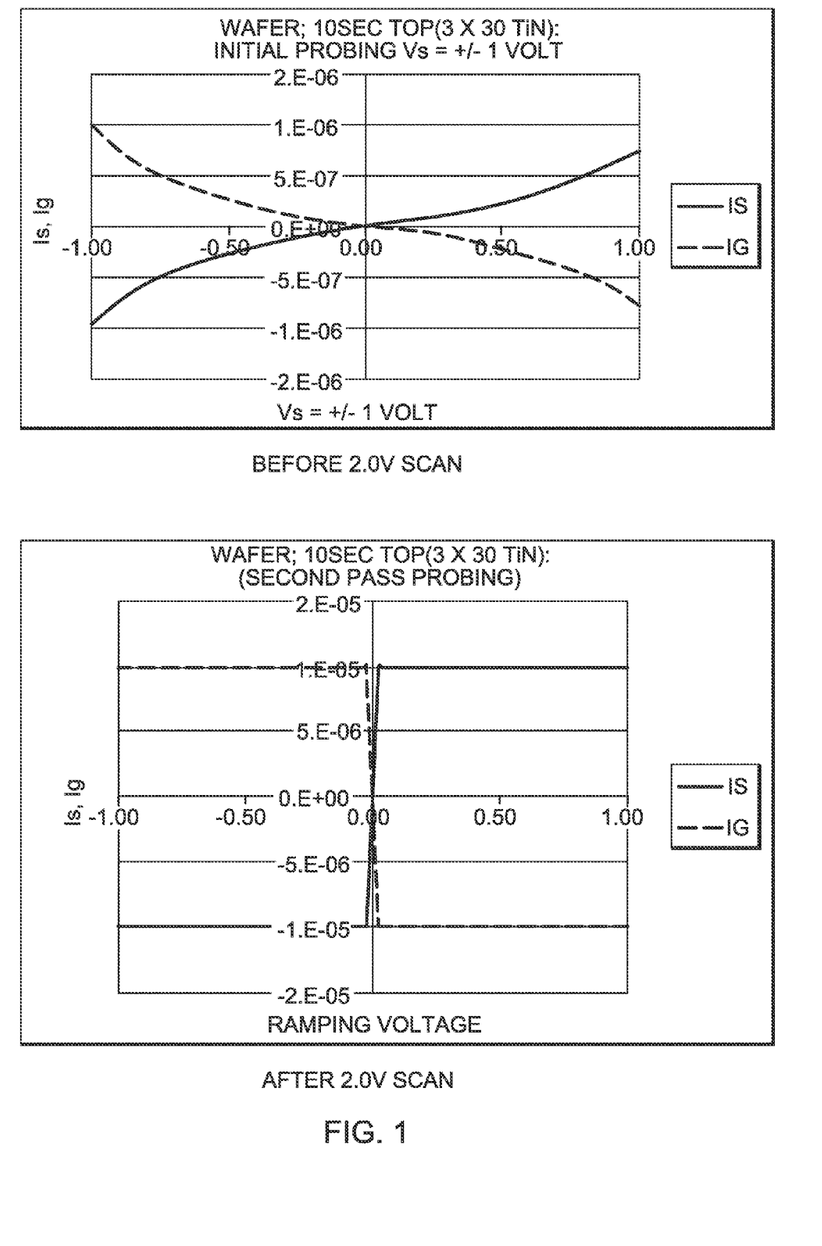
FIG. 1 are graphs illustrating the change in conductivity before and after a high voltage is applied to untreated CVD titanium nitride.

To illustrate, semiconductor wafers were prepared having three layers of CVD titanium nitride. Each of the CVD titanium nitride layers was 30 angstroms thick. The wafer was treated in forming gas for 10 seconds which converted the top layer of untreated titanium nitride to treated titanium nitride. A voltage scan of −1 volt to +1 volt was applied to one circuit while a voltage scan of −2 volts to +2 volts was applied to the same circuit. In the latter case, the circuit was scanned again at −1 volt to +1 volt. The results are illustrated in FIG. 1. "IS" is the source current and "IG" is the ground current. It can be seen that with respect to the circuit on the left where a 1 volt scan was applied, the titanium nitride has high resistance while with respect to the circuit on the right where a 2 volts scan was applied, the titanium nitride is now conductive. In the Figure on the left, the current starts at zero and gradually ends up at around 1 E-06 while in the Figure on the right, the current almost immediately jumps to 1E-05, which is the saturation current of the instrument indicating that the likely current is higher. The measurement indicates before the 2V scan, the resistance is about $10^6$ Ohm~Mega-Ohm, and after the 2.0V scan, the resistance is about 100 Ohm. That is 4 order changes in the resistance before and after the high voltage scan.

The actual voltage and current that needs to be applied to turn untreated titanium nitride from resistive to conductive will vary depending on the design of the process flow. The voltage and current that is needed can be readily determined by a person skilled in the art without undue experimentation.

Figure 2A:
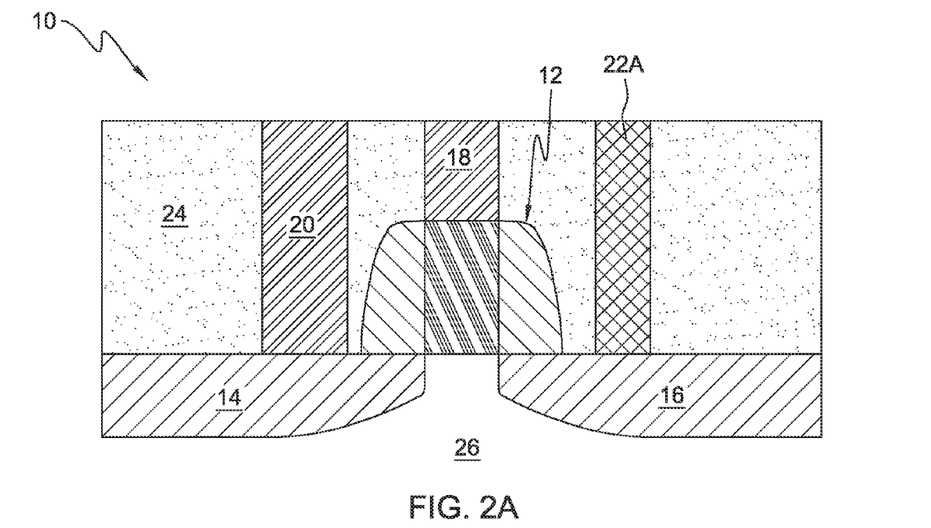
FIG. 2A is a partial cross sectional view illustrating a first embodiment of a VSR and FIG. 2B is a partial cross sectional view illustrating a second embodiment of a VSR.

Referring now to FIG. 2A, there is shown a first embodiment of the present invention. Shown in FIG. 2A is a semiconductor 10 which includes the usual gate structure 12, semiconductor material 26, source 14 and drain 16. In contact with the gate structure 12 is a first CA contact 18 and in contact with source 14 is a second CA contact 20. First and second CA contacts 18, 20 are conventional. Also shown in FIG. 2A is a VSR 22A in contact with drain 16 of the semiconductor 10. First and second CA contacts 18, 20 and VSR 22 are embedded in a conventional dielectric material 24 as is known in the art.

Figure 2B:
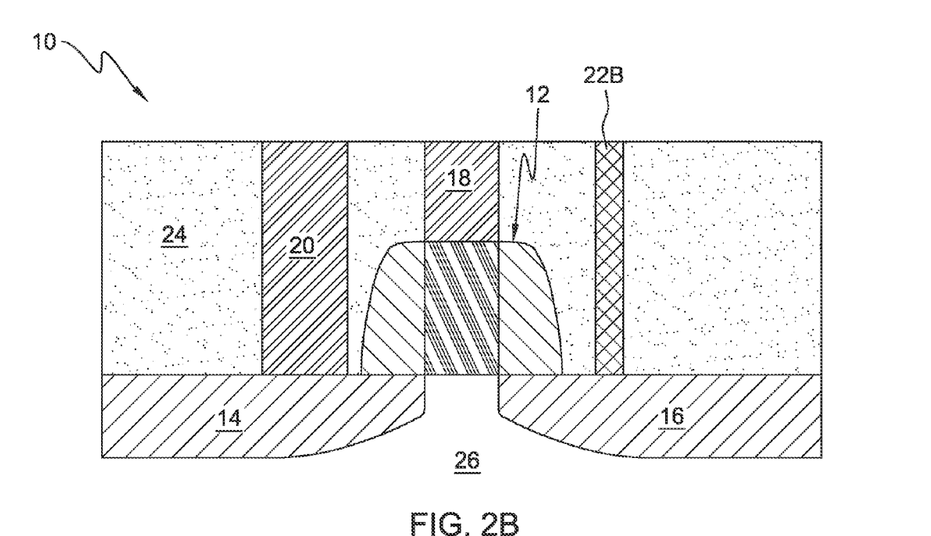

Referring now to FIG. 2B, there is shown a second embodiment of the present invention. The second embodiment of the invention is identical to the first embodiment of the invention except that VSR 22B is smaller. For purposes of illustration and not limitation, VSR 22A may have a via diameter of about 90 nm while VSR 22B may have a via diameter of about 45 nm. The size of the VSR 22A, 22B may affect the processing to form the VSR 22A, 22B as will be explained hereafter. VSR 22A and VSR22B may collectively hereafter be simply denoted at VSR 22.

The semiconductor material 26 may be any semiconductor material including but not limited to group IV semiconductors such as silicon, silicon germanium or germanium, a III-V compound semiconductor, or a II-VI compound semiconductor. The semiconductor material may be a bulk semiconductor material or silicon-on-insulator.

Figure 3:
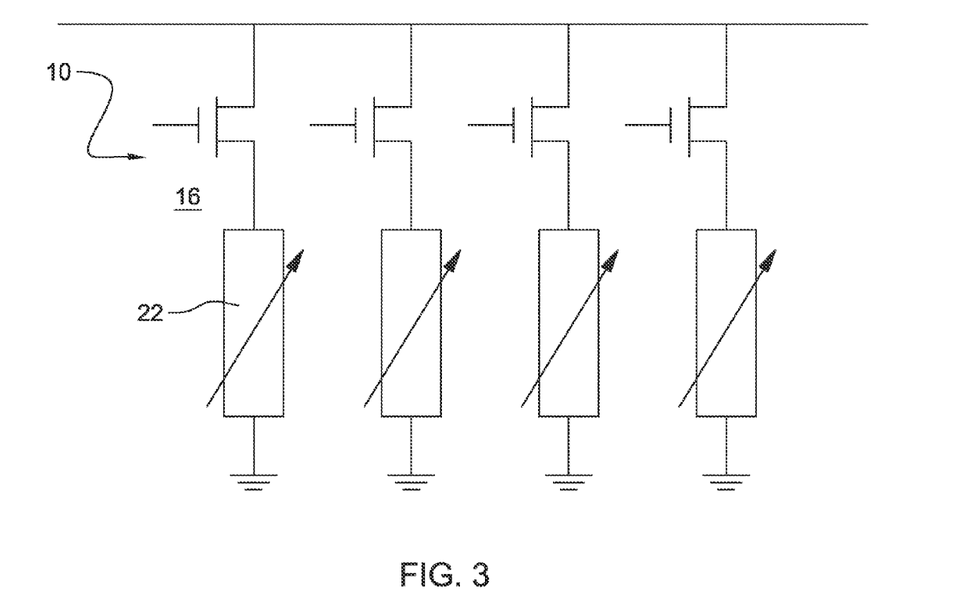
FIG. 3 is an exemplary circuit for a VSR ROM incorporating the VSR of FIG. 2.

Referring now to FIG. 3, the VSR 22 is shown in a circuit with the semiconductor 10 wherein the VSR 22 is electrically and physically connected to drain 16 of the semiconductor 10. The VSR 22 in combination with the semiconductor 10 comprises a VSR read only memory (ROM) device. When initially formed, VSR 22 is highly resistive so very little current flows through the VSR 22 and the semiconductor 10. When a predetermined voltage and current are applied to the VSR 22, it becomes conductive by at least an order of $10^2$, more preferably $10^3$ and most preferably $10^4$. The resistance changes from about $10^6$ ohm (Mega Ohm) to about 100 Ohm in the most preferred embodiment. The change in resistance makes the VSR 22 in combination with the semiconductor 10 useful as a memory device. Since the change in resistance occurs only once, the memory device may be referred to as write once, read only memory (WO ROM). Low voltage and current are used to read the memory.

It can be seen from FIG. 3, that there can be a plurality of VSR ROM devices. In addition, the plurality of VSR ROM devices may be useful as a high density programmable logic circuit.

In FIGS. 2 and 3, the VSR 22 is shown in electrical and physical contact with drain 16 of semiconductor 10. It should be understood that the VSR 22 may alternatively be in contact with the source 14 of semiconductor 10.

Figure 4A:
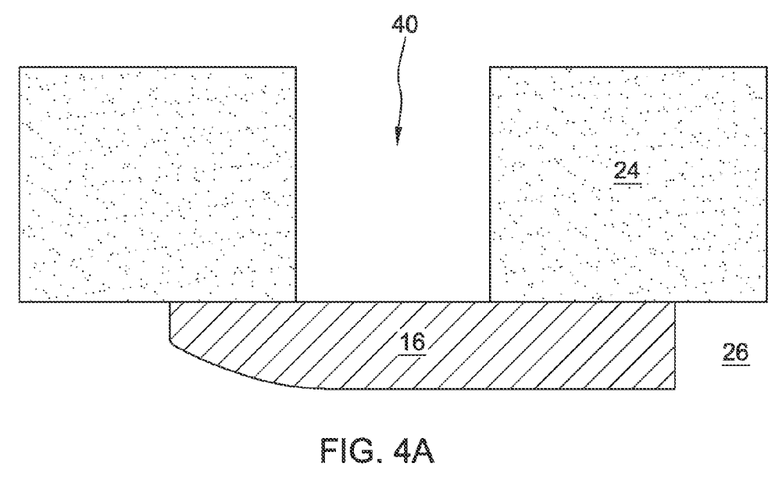
FIGS. 4A to 4E are partial cross sectional views illustrating the method of forming the VSR in FIG. 2.
Figure 4B:
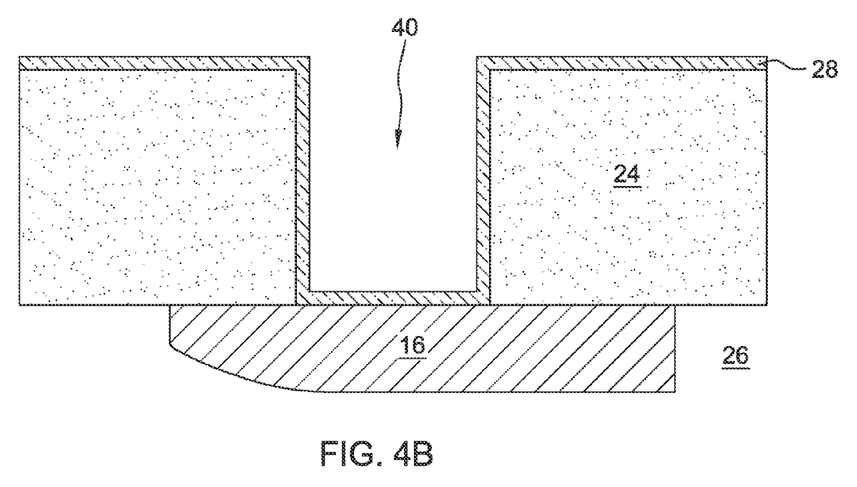
Figure 4C:
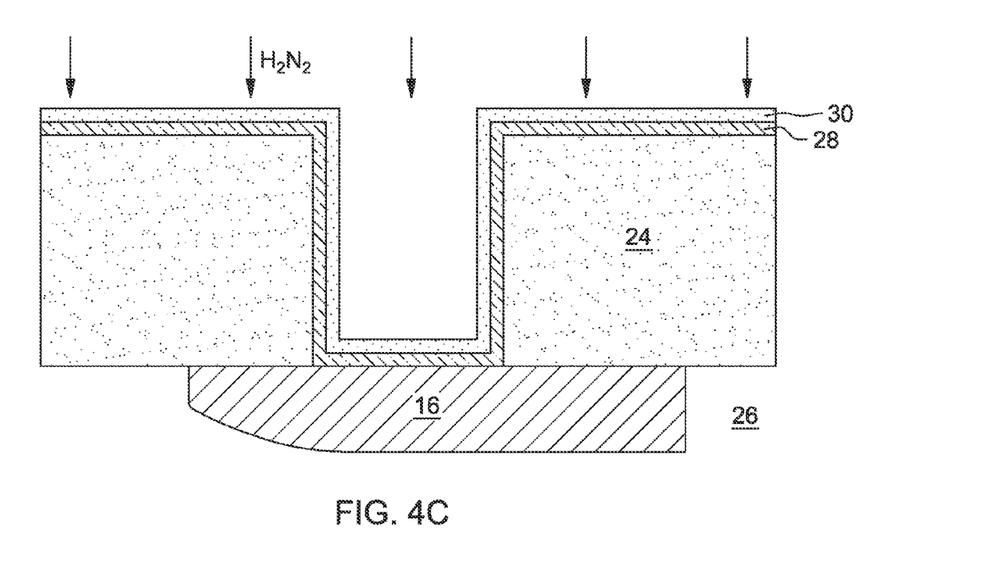
Figure 4D:
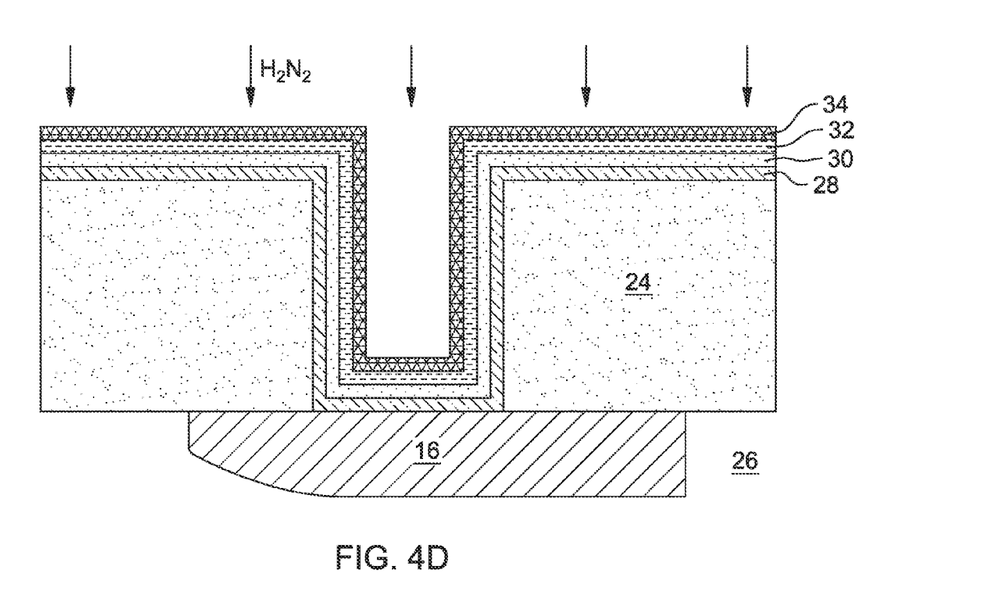

The process for forming VSR 22 is shown in greater detail in FIGS. 4A to 4E. VSR 22 is a multilayer structure formed within an opening 40, such as a via or trench, within dielectric 24 which includes at least one layer of untreated or partially treated CVD titanium nitride that has residual titanium-carbon bonding. After forming the opening 40 by conventional means as shown in FIG. 4A, the opening may be sputter cleaned. At the bottom of opening 40 and within drain 16, there may be a silicide which is not shown for clarity. As shown in FIG. 4B, a titanium layer 28 is blanket deposited by physical vapor deposition. Next, CVD titanium nitride layer 30 is deposited and then treated with forming gas for about 35 seconds to partially or totally remove the carbon as shown in FIG. 4C. This CVD titanium nitride layer 30 is optional. Referring now to FIG. 4D, CVD titanium nitride layer 32 is formed and CVD titanium nitride layer 34 is formed. CVD titanium nitride layer 32 remains untreated while CVD titanium nitride layer 34 is then treated for about 35 seconds in forming gas to remove most or all of the residual titanium-carbon bonding and also seal the CVD titanium nitride layer 32. It has been discovered by the present inventors that if the untreated CVD titanium nitride layer 32 is exposed to the air, it forms TiOx, which is in the resistive phase and which cannot be converted to the lower resistance phase, no matter how high the voltage scan is. Thus, sealing of the CVD titanium nitride layer 32 is desirable.

Figure 4E:
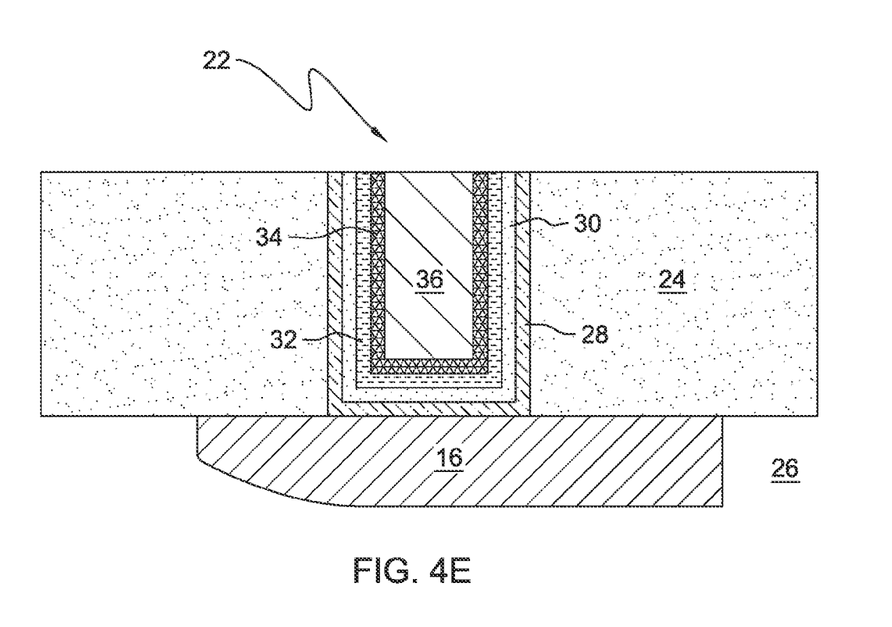

The titanium layer 28 may have a thickness of 1-10 nm, the optional treated CVD titanium nitride layer 30 may have a thickness of about 1 to 10 nm, the untreated CVD titanium layer 32 may have a thickness of about 1 to 20 nm, and the treated CVD titanium layer 34 may have a thickness of about 1 to 10 nm. The remainder of opening 40 is filled with a metal 36 such as tungsten or copper and then planarized to remove any excess material. The resulting structure shown in FIG. 4E is VSR 22. The VSR 22 can be deposited separately from the regular contact such as contact 20 and contact 18.

The process for forming the VSR 22 can be simplified such as by using the smaller VSR 22B shown in FIG. 2B. The optional CVD titanium nitride layer 30 may be dispensed with. CVD titanium nitride layers 32, 34 are deposited and treated as before. However, because the via diameter is so small, any treatment in forming gas won't reach the bottom of the via so the CVD titanium nitride at the bottom of the via remains untreated.

CVD titanium nitride may be formed from conventional precursors. The precursors may be, for example, TDMAT (Tetrakis (dimethyl amido) titanium), TEMAT (Tetrakis (ethylmethyl amido) titanium), In one process of forming the CVD titanium nitride layers, a semiconductor wafer is heated to about 400° C. while a gas consisting of argon and CVD titanium nitride precursor flows in the CVD chamber. The result is a CVD titanium nitride layer having residual titanium-carbon bonding which then may be partially or completely treated in forming gas to remove some or all of the residual carbon and reduce the titanium-carbon bonding. Layers having residual titanium-carbon bonding may be used in the present invention as a VSR.

The VSR ROM of the present invention may be used for high density memory. As an example, assume a 100 nm via and the distance between vias is 100 nm, then 4 gigabyte of information may be stored in a 1 cm$^2$ area using two levels of metal. Such high density memory has the advantage of no moving parts, it is easy to handle and has fast readout. This is to be compared to current CDs which hold about 600 megabytes in a 12×12 cm$^2$ area while DVDs hold about 5 gigabytes in a 12×12 cm$^2$ area. CDs and DVDs have the additional disadvantage of being easily scratched and require moving parts to read the information.

Figure 5:
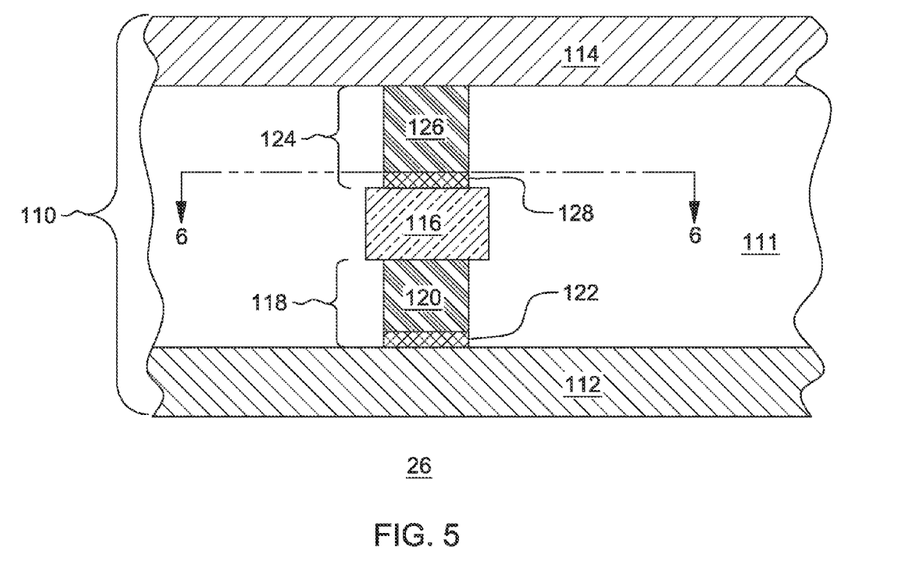
FIG. 5 is a partial cross sectional view illustrating a second embodiment of a VSR.

Referring now to FIG. 5, there is shown a second embodiment of the present invention. In this second embodiment of the present invention, the VSR is located in the back end of the line (BEOL) wiring layer, shown in FIG. 5 with reference number 110. The BEOL wiring layer 110 is made up of a number of sub-layers which are not shown in FIG. 5 for clarity. BEOL wiring layer 110 is attached to semiconductor substrate 26. Within BEOL wiring layer 110 is a first wiring line 112 in the X-direction and a second wiring line 114 in the X-direction. Between the first and second wiring lines 112, 114 is a third wiring line 116 in the Y-direction. The Y-direction is shown coming out of the page. Third wiring line 116 is approximately perpendicular to first and second wiring lines 112, 114. First, second and third wiring lines 112, 114, 116 are typically made from copper but may also be aluminum. Connecting first wiring line 112 and third wiring line 116 is via 118 and connecting third wiring line 116 and second wiring line 114 is via 124. The wiring lines 112, 114, 116 and vias 118, 124 are insulated from each other by a conventional dielectric material 111 as is known to a person skilled in the art. Via 118 includes a VSR 122 and a metal 120, typically copper or aluminum. Similarly, via 124 includes a VSR 128 and a metal 126, typically copper or aluminum. In the case of the vias 118, 124, the VSR 122, 128 is just a layer of untreated or partially treated CVD titanium nitride such that there is substantial titanium-carbon bonding present. VSR 122 controls the flow of current between first and third wiring lines 112, 116 while VSR 128 controls the flow of current between second and third wiring lines 114, 116.

Figure 6:
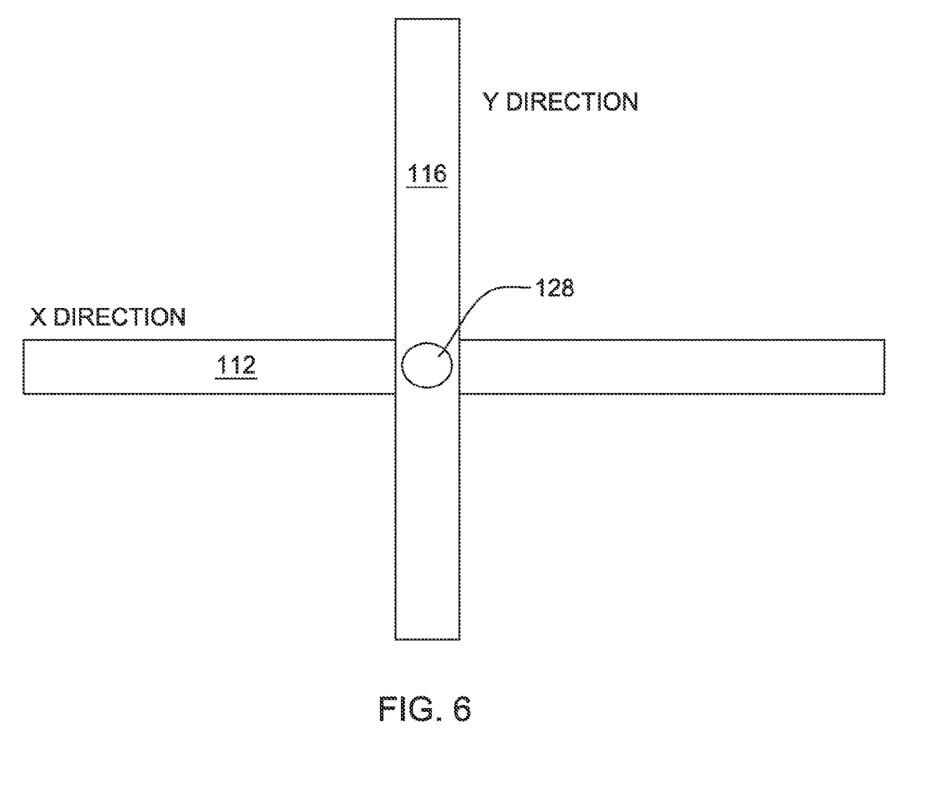
FIG. 6 is view taken in the direction of arrows 6-6 of FIG. 5.

FIG. 6 is a top down plan view of wiring layer 110 in the direction of arrows 6-6 shown in FIG. 5. It can be seen that first and third wiring lines 112, 116 are in an approximate perpendicular relationship. The second wiring line 114 is on top of first wiring line 112, and it is not shown in this Figure for clarity.

Figure 7:
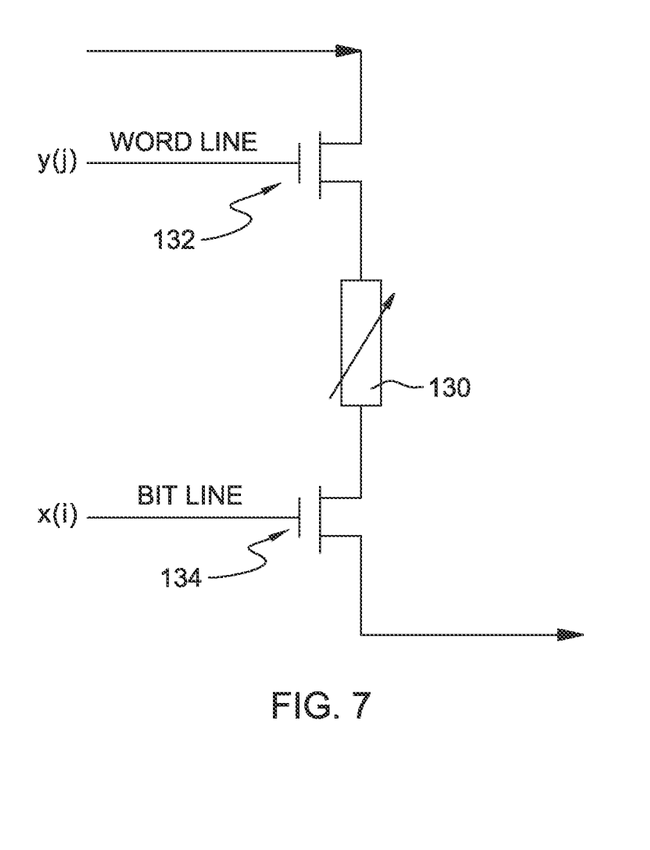
FIG. 7 is a first exemplary circuit utilizing the VSRs of FIG. 5.

Referring now to FIG. 7, there is shown an exemplary circuit including a VSR 130 connected to one or more semiconductors 132, 134. VSR 130 is connected to the source of semiconductor 134 while VSR 130 is connected to the drain of semiconductor 132. For instance, the device 134 is connected with line 112 in FIG. 6 and device 132 is connected with line 116, so one device is connected to the word line and the other device is connected to the bit line. y(j) and x(i) refer to the x and y lines in the BEOL wiring layer 110 of FIG. 5. Referring to FIGS. 5 and 7 together, the VSR 130 in FIG. 7 can be either of the VSRs 122, 128 shown in FIG. 5. The VSR 130 along with semiconductors 132, 134 comprise a VSR ROM device. When initially formed, VSR 130 (VSR 122 or 128 in FIG. 5) is highly resistive at a range of about 10$^6$ Ohm (Mega-Ohm) to 10$^4$ Ohm so very little current flows through the VSR 130 and the semiconductors 132, 134. When a predetermined voltage and current are applied to the VSR 130, it becomes conductive with a resistance of about 100 Ohm. This change in resistance makes the VSR 130 in combination with the devices 132, 134 useful as a memory unit. Since the change in resistance occurs only once, the memory device may be referred to as write once, read only memory.

The circuit shown in FIG. 7 may also be useful as a high density programmable logic circuit.

Figure 8:
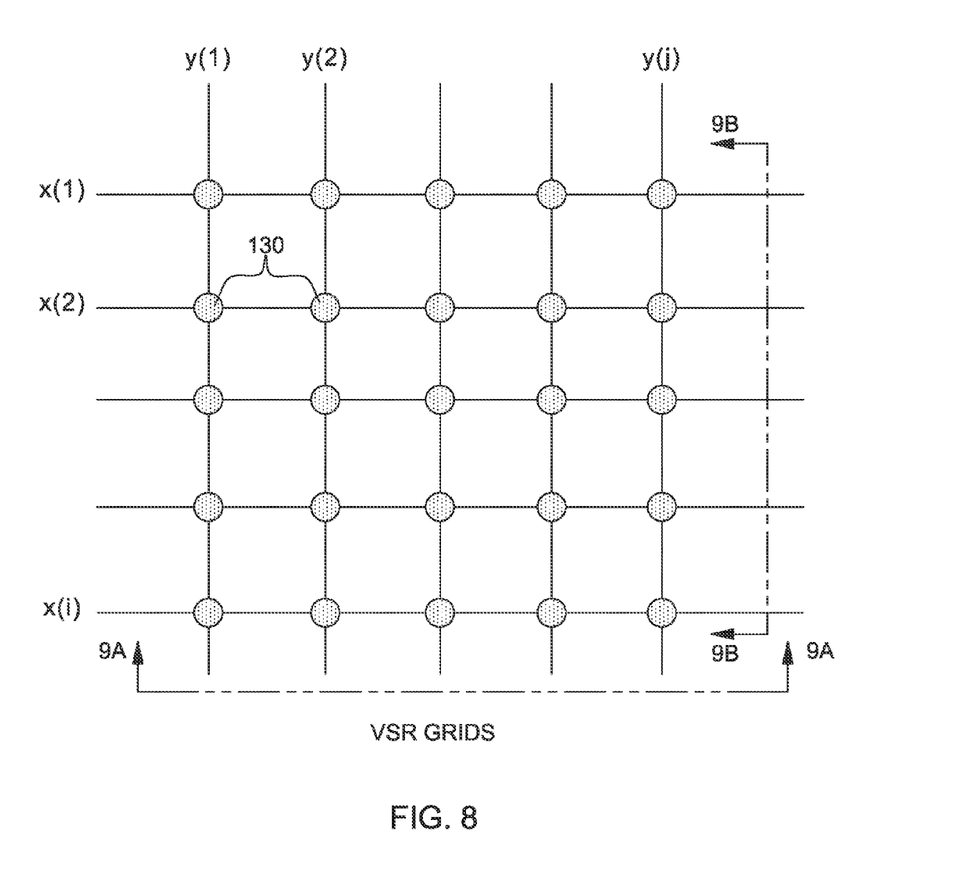
FIG. 8 is a plan view of a second exemplary circuit utilizing the VSRs of FIG. 5.

Referring now to FIG. 8, a VSR grid is shown with each node being controlled by a VSR 130. The FIG. 8 is the expansion of FIG. 7 with multiple VSR memory units contacting with bit line x(i) and word line y(j). Arrays of devices 134, 132 are connected to the bit line and the word line, which form grids of high density VSR memory storage area.

Figure 9A:
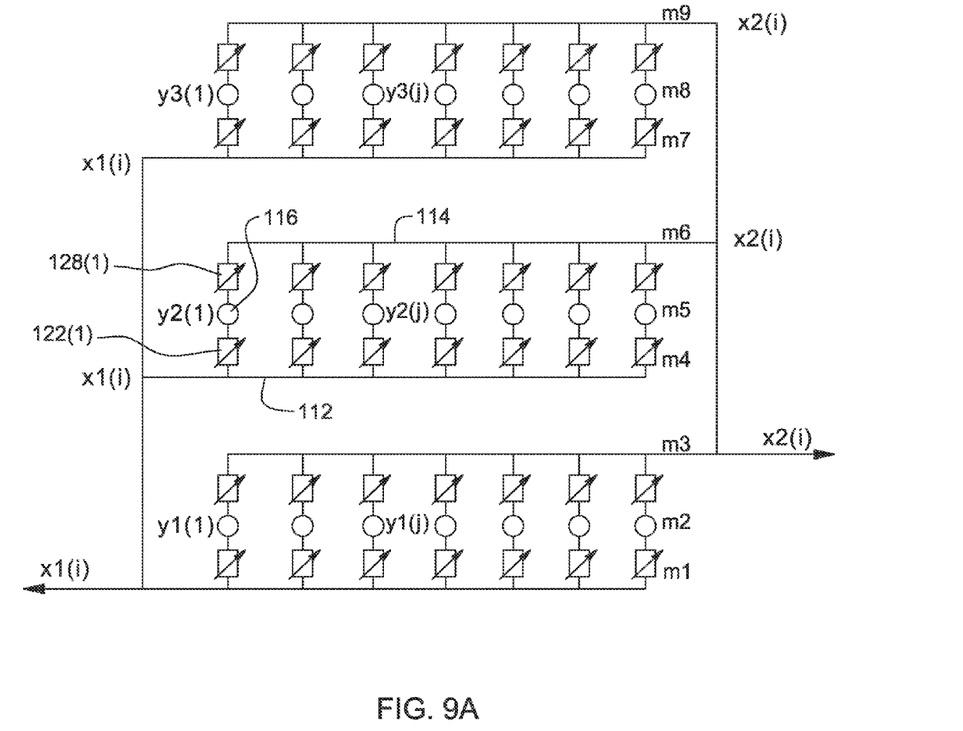
FIG. 9A is a cross sectional view of FIG. 8 along x(i) direction of a third exemplary circuit utilizing the VSRs of FIG. 5. y(j) line is perpendicular to the x(i) line.

FIG. 9A shows one cross section of the plan view structure of FIG. 8. In this invention, all control devices, devices 132 and 134, are located in the plane of the semiconductor material, while memory storage contacts are in the upper level of the metal contact in the BEOL wiring layer. This helps to maximize the memory storage density. To further increase the density of the storage, different levels of x may be connected together as x1(i) or x2(i). x1(i) is connected with one bit line device, such as device, 134, and x2(i) is connected with a different bit line device 134. However to avoid x-y cross-over and make sure that one has a unique memory location, y1(j), y2(j), y3(j) . . . , are connected to the different word line device, such as device, 132. In other words, each numbering of the x and y has a different device connection.

Figure 9B:
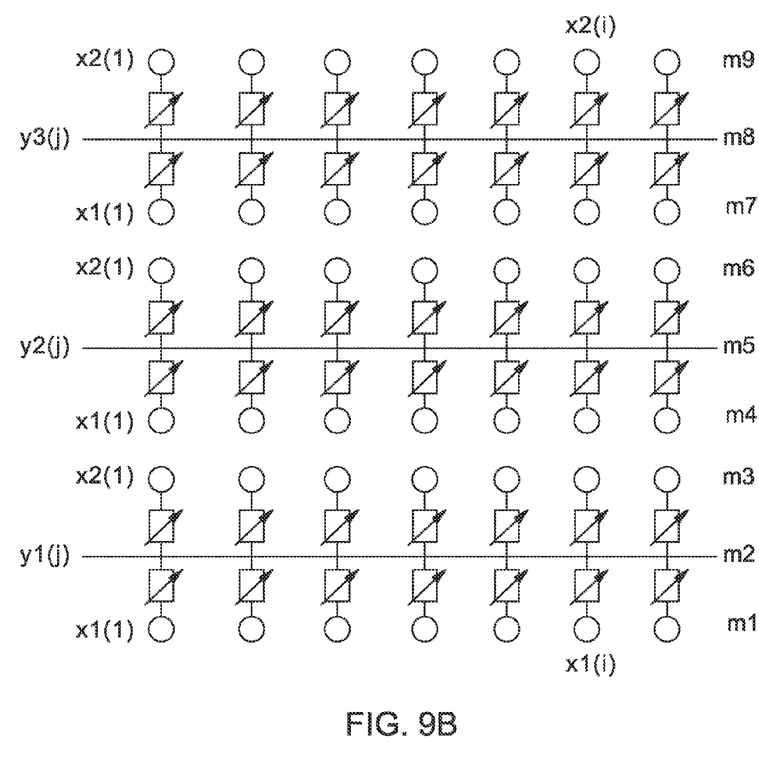
FIG. 9B is a cross sectional view of FIG. 8 along y(j) direction.

FIG. 9A is now described in more detail. All x1(i) lines (such as m1, m4, m7 shown in FIG. 9A) may be connected to a single device such as bit line device 134. All x2(i) lines (such as m3, m6, m9 shown in FIG. 9) may be connected to a single device such as another bit line device 134. Each VSR 122, 128 is configured as schematically shown in FIG. 7. For example, VSR 128(1) is connected by Y-line y2(1) 116 to a device such as word line device 132 and by X-line x2(i) 114 to a device such as bit line device 134. VSR 128 (1) along with devices 132, 134 comprise a VSR ROM device. Similarly, VSR 122 (1) is connected by Y-line y2(1) 116 to a device such as word line device 132 and by X-line x1(i) 112 to a device such as another bit line device 134. VSR 122(1) along with devices 132, 134 comprise a VSR ROM device. Each VSR 122, 128 is separately addressable. FIG. 9B is a perpendicular view of FIG. 9A along the y(j) direction.

Each three levels of metal in the BEOL wiring layer, for example m1-m3, make up a block of VSR ROM devices. The configuration shown in FIG. 9A and FIG. 9B may continue for as many metal levels as are present in the BEOL wiring layer. It should also be understood that the configuration shown in FIG. 9A and FIG. 9B represent only a vertical slice through the BEOL wiring layer and there are many more X-direction wiring lines in the BEOL wiring layer which can form similar blocks of VSR ROM device.

According to the invention, the VSR ROM, which has an unique address for reading and writing, is connected with at least two cross-over semiconductor devices with multiple levels of VSR stack, to maximize the number of VSRs with a minimum number of semiconductor devices at the semiconductor level.

In a preferred embodiment of the invention, the BEOL wiring layer includes at least one VSR ROM memory array. The VSR ROM memory array includes a first sub-layer having a first wiring line in an X-direction, a second sub-layer having a plurality of wiring lines in a Y-direction and a third sub-layer having a second wiring line in an X-direction with the sub-layers alternating in the order of first sub-layer, second sub-layer and third sub-layer; and a plurality of via pairs each comprising a via connecting the X-wiring line in the first sub-layer to a Y-wiring line in the second sub-layer and another via connecting the X-wiring line in the third sub-layer to the same Y-wiring line in the second sub-layer, each of the vias including a VSR, with each via pair connecting to a different Y-wiring line in the second sub-layer. The VSR ROM memory array may be formed in three levels of metal wiring in the BEOL wiring layer.

In a further preferred embodiment of the present invention, there are a plurality of VSR ROM memory arrays arranged such that at least some of the first wiring lines are common to a single X-wiring line in the first sub-layer and connected to a first semiconductor device and at least some of the second wiring lines are common to a different X-wiring line in the third sub-layer and connected to a second semiconductor device. The plurality of VSR ROM memory arrays may be arranged as to be stacked on one another.

It is important to note that in the second embodiment of the present invention, the VSRs are located in the BEOL wiring layer 110 while the devices (for example, 132, 134 shown in FIG. 7) are at the semiconductor base level. Thus, while the VSRs are in electrical contact with the source or drain of semiconductors, the VSRs are not in actual physical contact with the semiconductors. An advantage of the embodiment shown in FIG. 9A and FIG. 9B is that a large number of VSRs in the BEOL wiring layers 110 are controlled by a smaller number of semiconductors in the semiconductor base level.

If we have N by N grids and with K level of tri-layer metal (two x levels and one y level) we will have storage cell number as $2K*N*N$ cells with device number of $(2+K)*N$.

Figure 10:
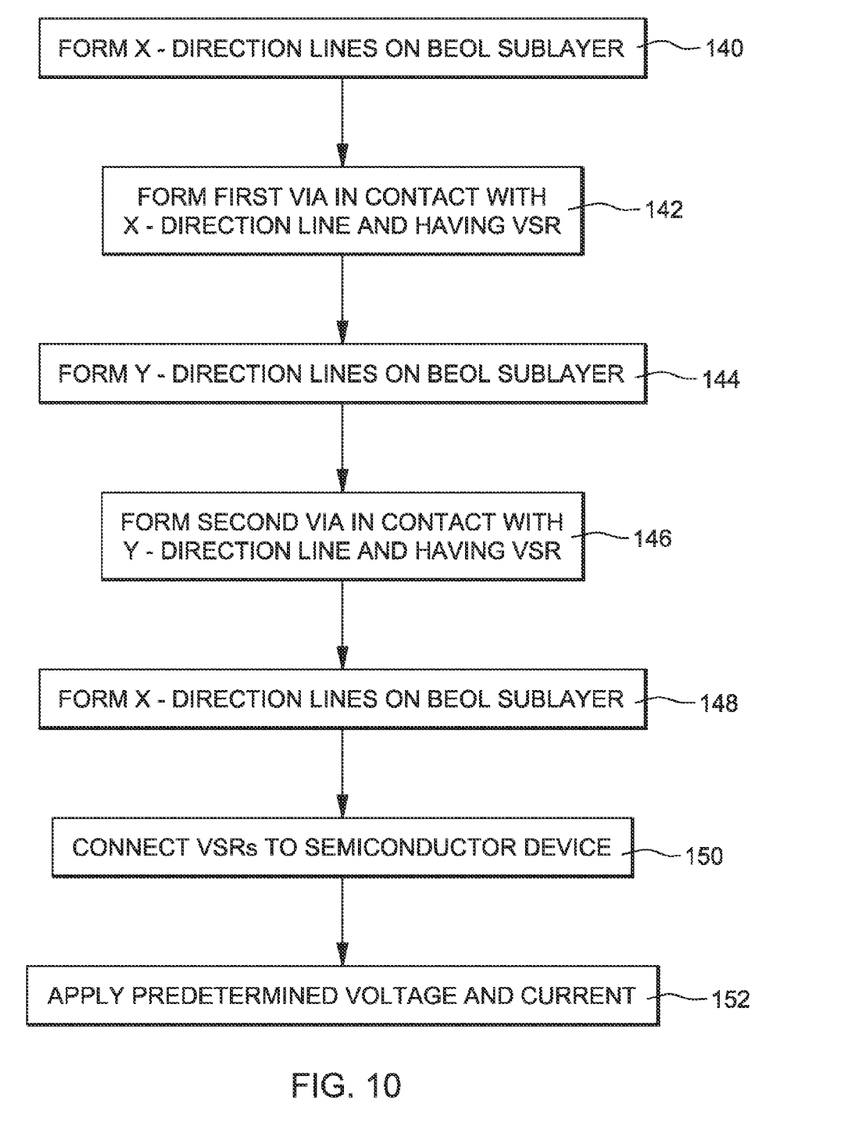
FIG. 10 is a flow chart illustrating a method of forming the VSRs of FIG. 5.

The method for forming the VSR ROM device of FIG. 5 on a semiconductor substrate having a semiconductor device is illustrated in FIG. 10. The semiconductor base has a BEOL wiring layer which includes a number of sub-layers. In a typical BEOL wiring layer, there are wiring lines in the X-direction and wiring lines in the Y-direction and the two types of wiring lines are connected by a via in the Z-direction. The X and Y wiring lines are normally on separate sub-layers and they alternate between sub-layers.

In a first step of the process, wiring lines in an X-direction are conventionally formed on a sub-layer as indicated in box 140. A first via is formed in contact with the wiring lines in the X-direction as indicated in box 142. The first via may be in a separate sub-layer. The first via includes a VSR having an untreated or partially treated CVD titanium nitride layer having residual titanium-carbon bonding such that the VSR is resistive as formed and can become less resistive by at least an order of $10^2$ when a predetermined voltage and current are applied to the VSR. The CVD titanium nitride layer may be formed in the same manner as in the first embodiment of the present invention. In addition to the CVD titanium nitride layer, the first via will also include a conventionally-formed metal such as copper or aluminum as shown in FIG. 5. In the next BEOL wiring sub-layer, wiring lines in a Y-direction are conventionally formed on the sub-layer, as indicated by box 144, with at least one of the Y-direction wiring lines in contact with the first via. A second via is formed in contact with the wiring lines in the Y-direction as indicated by box 146. The second via may be in a separate sub-layer. The second via includes a VSR having an untreated or partially treated CVD titanium nitride layer having residual titanium-carbon bonding such that the VSR is resistive as formed and can become less resistive by at least an order of $10^2$ when a predetermined voltage and current are applied to the VSR. The CVD titanium nitride layer may be formed in the same manner as in the first embodiment of the present invention. In addition to the CVD titanium nitride layer, the first via will also include a conventionally-formed metal such as copper or aluminum as shown in FIG. 5. As indicated by box 148, a next BEOL wiring sub-layer having wiring lines in an X-direction is formed with at least one of the X-direction wiring lines in contact with the second via. Then, the VSRs in the first and second vias are connected to the semiconductor device as indicated in box 150. Lastly, as indicated in box 152, a predetermined voltage and current are applied to make the CVD titanium nitride layers in the first and second vias less resistive by at least an order of $10^2$.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

We claim:

1. A method of forming a voltage sensitive resistor (VSR) read only memory (ROM) device on a semiconductor substrate having a semiconductor device, the method comprising the steps of:
    forming a VSR in electrical contact with the semiconductor device comprising:
        forming a layer of insulation on the semiconductor device;
        forming an opening in the insulation, the opening aligned with the semiconductor device;
        depositing a layer of physically deposited elemental titanium in the opening;
        depositing on the elemental titanium by chemical vapor deposition a first titanium nitride layer having residual titanium-carbon bonding such that the VSR is resistive as formed and can become less resistive by at least an order of $10^2$ when a predetermined voltage and current are applied to the VSR;
        depositing on the first titanium nitride layer by chemical vapor deposition a second titanium nitride layer having residual titanium-carbon bonding such that the VSR is resistive as formed and can become less resistive by at least an order of $10^2$ when a predetermined voltage and current are applied to the VSR;
        treating the second titanium nitride layer to substantially remove the titanium-carbon bonding; and
        depositing a metallic layer in contact with the second titanium nitride layer;
    wherein the VSR in electrical contact with the semiconductor device forms a VSR ROM device and wherein the VSR ROM device is a write once read only memory (WO ROM) device.

2. The method of claim 1 further comprising applying a predetermined voltage and current so as to make the first titanium nitride layer less resistive by at least an order of $10^2$.

3. The method of claim 1 further comprising applying a predetermined voltage and current so as to make the first titanium nitride layer less resistive by an order of $10^3$.

4. The method of claim 1 further comprising applying a predetermined voltage and current so as to make the first titanium nitride layer less resistive by an order of $10^4$.

5. The method of claim 1 wherein the metallic layer is tungsten or copper.

6. The method of claim 1 wherein the VSR is in direct contact with the semiconductor device.

7. The method of claim 1 wherein the VSR is in direct contact with a source or drain of the semiconductor device.

8. The method of claim 1 wherein the semiconductor substrate includes a back end of the line (BEOL) wiring layer on the semiconductor substrate and wherein forming a VSR in electrical contact with the semiconductor device include forming the VSR within the BEOL wiring layer.

9. The method of claim 1 wherein between depositing a layer of physically deposited elemental titanium and depositing by chemical vapor deposition a first titanium nitride layer, further comprising:
    depositing by chemical vapor deposition an initial layer of titanium nitride having residual titanium-carbon bonding such that the VSR is resistive as formed and can become less resistive by at least an order of $10^2$ when a predetermined voltage and current are applied to the VSR; and
    treating the initial titanium nitride layer to partially or totally remove the titanium-carbon bonding.

10. A method of forming a voltage sensitive resistor (VSR) read only memory (ROM) device on a semiconductor substrate having a semiconductor device, the method comprising the steps of:
    forming a VSR in electrical contact with the semiconductor device comprising:
        depositing a layer of physically deposited elemental titanium on the semiconductor device;
        depositing by chemical vapor deposition a first titanium nitride layer having residual titanium-carbon bonding such that the VSR is resistive as formed and can become less resistive by at least an order of $10^2$ when a predetermined voltage and current are applied to the VSR;
        depositing by chemical vapor deposition a second titanium nitride layer having residual titanium-carbon bonding such that the VSR is resistive as formed and can become less resistive by at least an order of $10^2$ when a predetermined voltage and current are applied to the VSR;
        treating the second titanium nitride layer to substantially remove the titanium-carbon bonding; and
        depositing a metallic layer in contact with the second titanium nitride layer;
    wherein the VSR in electrical contact with the semiconductor device forms a VSR ROM device and wherein the VSR ROM device is a write once read only memory (WO ROM) device.

11. The method of claim 10 further comprising applying a predetermined voltage and current so as to make the first titanium nitride layer less resistive by at least an order of $10^2$.

12. The method of claim 10 further comprising applying a predetermined voltage and current so as to make the first titanium nitride layer less resistive by an order of $10^3$.

13. The method of claim 10 further comprising applying a predetermined voltage and current so as to make the first titanium nitride layer less resistive by an order of $10^4$.

14. The method of claim 10 wherein the metallic layer is tungsten or copper.

15. The method of claim 10 wherein the VSR is in direct contact with the semiconductor device.

16. The method of claim 10 wherein the VSR is in direct contact with a source or drain of the semiconductor device.

17. The method of claim 10 wherein the semiconductor substrate includes a back end of the line (BEOL) wiring layer on the semiconductor substrate and wherein forming a VSR in electrical contact with the semiconductor device include forming the VSR within the BEOL wiring layer.

18. The method of claim 10 wherein between depositing a layer of physically deposited elemental titanium and depositing by chemical vapor deposition a first titanium nitride layer, further comprising:
    depositing by chemical vapor deposition an initial layer of titanium nitride having residual titanium-carbon bonding such that the VSR is resistive as formed and can become less resistive by at least an order of $10^2$ when a predetermined voltage and current are applied to the VSR; and
    treating the initial titanium nitride layer to partially or totally remove the titanium-carbon bonding.

19. A method of forming a voltage sensitive resistor (VSR) read only memory (ROM) device in a back end of the line (BEOL) wiring layer on a semiconductor substrate having a semiconductor device, the method comprising the steps of:

forming a BEOL wiring sub-layer having first wiring lines in an X-direction;

forming a first via in contact with at least one of the first wiring lines, the first via comprising a VSR having a chemically vapor deposited (CVD) titanium nitride layer having residual titanium-carbon bonding such that the VSR is resistive as formed and can become less resistive by at least an order of $10^2$ when a predetermined voltage and current are applied to the VSR;

forming a BEOL wiring sub-layer having second wiring lines in a Y-direction, at least one of the second wiring lines in contact with the first via;

forming a second via in contact with the at least one of the second wiring lines, the second via comprising a VSR having a CVD titanium nitride layer having residual titanium-carbon bonding such that the VSR is resistive as formed and can become less resistive by at least an order of $10^2$ when a predetermined voltage and current are applied to the VSR;

forming a BEOL wiring sub-layer having third wiring lines in an X-direction, at least one of the third wiring lines in contact with the second via; and connecting the VSRs in the first and second vias to the semiconductor device;

wherein the VSRs connected with the semiconductor device form a VSR ROM device and wherein the VSR ROM device is a write once read only memory (WO ROM) device.

20. The method of claim 19 further comprising applying a predetermined voltage and current so as to make the CVD titanium nitride layers in the first and second vias less resistive by an order of at least $10^2$.

* * * * *